United States Patent [19]

Muller et al.

[11] Patent Number: 4,866,215
[45] Date of Patent: Sep. 12, 1989

[54] CABLE MANAGEMENT SYSTEM FOR EQUIPMENT ENCLOSURE

[75] Inventors: Peter H. Muller, Los Gatos; Peter E. Lowe, Palo Alto; Randy J. Bleske, San Jose, all of Calif.; Vikram Bhargava, Alpharetta, Ga.; James R. Heberling, Lawrenceville, Ga.; Donald A. Muntner, Stone Mountain, Ga.

[73] Assignee: Hayes Microcomputer Products, Inc., Norcross, Ga.

[21] Appl. No.: 202,948

[22] Filed: Jun. 6, 1988

[51] Int. Cl.$^4$ .............................................. H05K 5/02
[52] U.S. Cl. ..................................... 174/50; 312/223; 361/428
[58] Field of Search ................... 174/50, 52.1, 135; 361/390, 391, 428; 364/708; 312/7.1, 7.2, 223

Primary Examiner—Laramie E. Askin
Attorney, Agent, or Firm—Jones, Askew & Lunsford

[57] ABSTRACT

A cable management system for directing cables connected to the back of an equipment enclosure of the type containing a computer peripheral device or other electronics apparatus to enter and exit the equipment enclosure at a selected one of a plurality of predetermined orientations. A bottom cover of the equipment enclosure is provided with a recessed portion including a vertical wall upon which is mounted receptacles for receiving cable terminations. Upper stanchion portions at the rear of the recessed portion together with a hinged plate or with lower stanchion portions contacting the upper stanchion portions from the bottom form rear legs for the equipment enclosure. The rear legs and the vertical wall of the recessed portion confine cable entry and exit positions to particular angular segments corresponding to the sides and rear of the equipment enclosure. Injection molded latches each including an elongated finger and a retaining tab are included within the upper and lower stanchion portions for connecting them together.

12 Claims, 4 Drawing Sheets

CABLE MANAGEMENT SYSTEM FOR EQUIPMENT ENCLOSURE

TECHNICAL FIELD

The present invention relates to systems for managing cables entering and exiting electronic equipment enclosures, and particularly discloses an improved construction for managing one or more cables connected to a computer peripheral device that constrains the cables to enter and exit the device at a selected one of a plurality of predetermined orientations.

BACKGROUND OF THE INVENTION

In recent years in the Western world, the great proliferation of electronic equipment has lead to a like proliferation of various cables for interconnecting pieces of such equipment to perform various functions. Anyone who has ever set up a component high fidelity system in the home is aware of the unsightly rat's nest of cables which can, and does, grow like kudzu around such installations.

In the last ten years, revolutions in integrated circuit technology have led to the widespread proliferation of small computers, commonly referred to as personal computers, throughout homes and businesses in the industrialized world. Computing power and storage capacity is now available for a relatively small price, which, 15 years ago, could only be obtained at the facilities of large corporations or university computing centers. The rapid decline of the cost per unit of computer capability has led to increased sophistication of small computer systems found in the home and the office. This has led to a common practice of having one or more computer peripheral devices collected at the computing site. In particular, a modem is one of the most common computer peripherals found at such locations.

Many modems are connected to serial ports via standard DB-25 connector plugs whuch are designed to connect to 25-conductor cables. Even though the conductors are somewhat small, and often a cable is realized using less than 25 conductors, such cables tend to be somewhat bulky. In a typical modem, stand-alone intelligent modem, one DB-25 connector requiring a substantial cable is used. Additionally, such modems commonly have two telephone ports and a power line connection. One of the telephone ports connects directly to a telephone line tap and the other is provided as a convenience outlet for a telephone set which is connected to the phone line when the modem is not in use. Typically, the power line connector is a relatively small gauge low-power connection to the secondary of a wall mounted transformer, although direct connection to the AV power distribution lines is also used. These cables are various sizes and various lengths.

Because the DB-25 plug typically is somewhat large and thick, it is common to provide a form of strain relief at the point where the cable enters the plug. This prevents the cable conductors from pulling loose from the pins if the cable is bent about a small radius of curvature near the point where the cable enters the plug. This provides several centimeters of the cable structure between the end of the plug and the main body of the cable which is relatively stiff.

As computers have become more and more popular in the executive office and in the home, it has become more popular to install such devices in "computer furniture" and other aesthetically pleasing arrangements which befit the home or executive office environment. Many such arrangements include installation of devices in cabinetry having rear walls. In a typical prior art installation, the relatively stiff portion of the serial port cable will encounter the rear wall of such a piece of furniture and will resist further backward movement. Also, pushing the modem farther back tends to cause it to become skewed as the section of the cable between the point contacting the wall and the modem's data port becomes bent under torsion. Also, in various layouts, the user often desires to somewhat neatly arrange the cables behind the installation once the computer and peripheral devices are in place.

Those experienced in working with such equipment will be very familiar with the phenomenon that, as soon as a device is picked up and moved, the cables tend to rearrange themselves in a somewhat random order, often under the feet of the body of the device in a manner which causes the device to no longer fit flush upon the surface where it formerly rested. This leads to bothersome manipulation of the cables, often accomplished by blindly sticking one's hand over the equipment and reaching behind the arrangement, followed by shaking and manipulating the cables until they fall into a configuration which allows the arrangement of components to be repositioned more or less in the manner desired.

As computer furniture and other arrangements for providing attractive configurations for small computer installations have become more popular, there has been a growing need for predictability of the volume occupied by peripheral devices. Many users have examined the dimensional specifications of a computer peripheral, and reached decisions with respect to installation of a system at the home or office, only to encounter the unexpected reality of the rearward clearance requirements of real-world cable connectors. This reality requires location of the peripheral devices several inches foreward of where they might have been originally planned by those who are uninitiated in this practice. This can lead to the disappointing discovery that the doors on a cabinet containing such a computer system cannot be closed.

Additionally, smaller computer peripherals, such as modems, have tended to become more lightweight in recent years. This is due in large part to the miniaturization of electronic components and the common practice of keeping the typically heaviest single component, the power transformer, outside of the modem's equipment enclosure and located in a wall-mounted encapsulated container where the transformer plugs into the AC distribution line. When such devices are installed in more conventional arrangements where the back of the modem tends to be near the rear edge of an open backed piece of furniture, or a computer or monitor upon which the modem is placed, the following can occur. Under these conditions, the modem is relatively lightweight, and a relatively heavy collection of cables may hang for a considerable distance from the back of the modem toward the floor. This can lead to a situation in which the effective weight of the hanging portion of the cable is enough to tend to rotate the modem about an axis defined by the rear feet of the enclosure, thus tending to raise the front end of the modem. When this occurs, some additional support must be given to the cabling in order to keep the front end of the modem from occasionally hopping up in the air, or from having the modem dragged off its normal resting place. The latter is particularly problematic if a modem is rested atop one of several popular CRT monitors which tend to have top surfaces of their cabinets which slope slightly downward as one proceeds from the screen area in the front toward the rear of the monitor.

Even if the modem is sufficiently heavy so that there is no problem with cable weight tending to lift it or pull it off the back of a flat, open-backed, piece of furniture, there is still the problem of the clearance required between such a piece of furniture and the wall. Users of prior art installations are generally required either to move the modem or other peripheral device forward on such a piece of furniture, leaving the cable connector and a length of cable exposed to view, or to move the entire piece of furniture out from the wall to give sufficient rearward clearance to the modem's connector and cable. Many people believe it is aesthetically more attractive to be able to have a rear end of the enclosure for a computer peripheral device substantially aligned with the rear edge of the planar surface of an openbacked piece of furniture such as a return or a credenza. In order to be able to keep such a piece of furniture as close as possible to the nearest wall, it is necessary to have some arrangement which will allow the peripheral's connector cables to make a sharp bend over the rear edge of such a piece of furniture and immediately start their downward descent.

Therefore, there is a need in the art for a practical and inexpensive arrangement for cable management in computer peripheral devices, and in particular, modems. In order to overcome some of the inconveniences and problems encountered in the prior art, the cable management system should have the following features. First, it should be easy to contend with and not require that the cable, which the user might wish to change at a later date, be permanently connected. Second, it is highly desirable that the cable management system be able to direct all the cables leading to the peripheral device so that the cables enter or exit the footing of the modem at one of a selected plurality of predetermined angular orientations. Since the footing for peripheral devices is typically rectangular, it is highly desirable that the angular orientations include at least three spaced apart by 90 degrees and corresponding to rearward exit and entry of the cables, and entry or exit from either side of the device.

Additionally, the cable management system should allow the other surfaces of the device, which do not correspond to planes cut by the cables, to be abutted directly against a surface such as the rear or side walls of an equipment cabinet. It is also highly desirable that the cable management system allow an arrangement whereby the rear edge of the equipment enclosure containing the peripheral device be substantially co-planar with, or only extend slightly beyond, the rear of a piece of furniture upon which the peripheral is sitting, and still allow the cables to hang directly downward over the rear edge of such furniture. It is desirable that this be accomplished in a manner which does not cause the cables to apply a significant moment to the peripheral device about an axis defined by its rear legs, thus tending to lift the front end of the peripheral in response to the weight of the hanging cables.

Additionally, such a cable management system should preclude random and accidental rearrangement of the cables in a manner which interferes with replacement of the peripheral device in its desired location if the device is ever moved for any reason.

SUMMARY OF THE INVENTION

The present invention fulfills the need of the prior art by providing an inexpensive cable management system for an equipment enclosure with a bottom cover and a recessed surface formed on the bottom cover. One edge of the recessed surface has a vertical wall having a cable connector mounted thereon. At least two upper stanchion portions are disposed on the recessed surface. At least two lower stanchion portions are disposed near the distal ends of either a plate or respective arms which are connected to the vertical wall by hinge means, permitting selective rotation of the plate or arms about an axis substantially parallel to the lower edge of the vertical wall.

In the preferred embodiment, the lower stanchion portions define at least three partially apertured sectors in the plane of the plate. The sectors direct all cables leading to the peripheral device so that they enter or exit the footing of the device at one of the three sectors. The preferred embodiment disclosed herein is designed to be used with standard computer peripheral devices having substantially rectangular shapes. Inasmuch as footing is typically rectangular for standard peripheral devices, the cable entry or exit through the selective plurality of sectors corresponds to exit and entry by the rearward and side portions of the device. In a preferred form of the present invention, the sectors define at least three angular orientations spaced apart by 90° and correspond to exit and entry by the side and rear portions of the device. In all forms of the present invention, the posts formed by the engagement of the upper and lower stanchion portions define cable entry and exit ports and operate to preclude the random and accidental rearrangement of cables if the peripheral device is ever moved for any reason.

In its preferred form, the cable management system has a latch formed within the upper and lower stanchion portions in order to connect the stancion portions together. The preferred embodiment includes, a novel injection molded latch disposed within the stanchion portions. The latch includes an elongated finger with a clip attached to the distal end thereof and a surface which the finger grabs when closed. These respective surfaces are beveled so that the latch is pushed laterally away from its quiescent position when closed and its tendency to move back toward that position provides force to grip the latch in a closed position. The surfaces are further beveled so that when the lower stanchion portions are pulled downward, the surfaces can slide by each other and the latch will give way. This allows an arrangement which is easily opened and closed but will remain closed during normal movement of the enclosure.

Additionally, the preferred embodiment of the present invention employs plastic hinges between the plate and the main body of the equipment enclosure. These hinges have been specifically designed so that if any foreign object or a large clump of cables is inadvertently caught under the plate while the user is attempting to close same, the hinges will withdraw prior to the plate breaking and can be reinserted when the situation is discontinued. Thus, the use of a simple and inexpensive plastic hinge intentionally designed to fail prior to breakage of the plate helps protect the device from breaking more expensive parts when cheap and easily-replaced ones may give way first.

In preferred forms of the present invention, the recessed surface formed on the bottom cover of the device provides rearward clearance of up to several inches for cable connectors. The recessed surface allows the other surfaces of the device to be abutted directly against rear or side cabinetry surfaces while permitting the cables to hang directly downward over the rear edge of such furniture.

In a preferred form of the present invention, a plate is connected to a lower edge of the vertical wall by hinges, allowing the plate to be selectively rotated about an axis substantially parallel to the lower edge of the vertical wall. At least two lower stanchion portions are disposed on an upper surface of the plate so as to engage the upper stanchion portions when the plate is moved to a closed position. The plate provided in a preferred form of the present invention has a substantially rectangular shape with at least two lower stanchion portions disposed near the distal end of the plate.

In an alternate form of the present invention, the lower stanchion portions are disposed near the distal ends of respective arms, rather than being placed at distal ends of a plate. The surface area of the arms in this embodiment is less than the surface area of the plate in the above embodiment. The important aspect of the present invention is that a closed loop be formed around a path from the surface to which the cables connect along the surface of the recessed area of the bottom of the receptacle, through the stanchion portions, and back along a plate of arm. By employing a closed surface, the cables will remain confined within the angular exit area determined by the user when the cables are first placed and the cable management apparatus is closed. In the absence of such a closed path, the cables may rearrange themselves whenever the device to which they are attached is lifted or moved.

Therefore, it is an object of the present invention to provide an inexpensive cable management system for an equipment enclosure which provides direction for all cables leading to the peripheral device so that the cables enter or exit the footing of the peripheral device at one of a selected plurality of predetermined angular orientations.

It is a further object of the present invention to provide a cable management system for an equipment enclosure which utilizes a latch and keeper device to connect upper and lower stanchion portions that is simple to manipulate and capable of being disengaged so that the cable configurations and cable connections may be changed by the user.

It is a further object of the present invention to provide a cable management system for an equipment enclosure which may be abutted at its rear or side surfaces against the rear or side walls of an equipment cabinet or the like.

It is a still further object of the present invention to provide a cable management system that allows an arrangement whereby the rear edge of the equipment enclosure containing the peripheral device is substantially co-planar with the rear of a piece of furniture upon which the peripheral is sitting, while permitting the cables to hang directly downward over the rear edge of such furniture.

It is a still further object of the present invention to provide a cable management system which permits all the cables leading to the peripheral device to enter or exit the footing of the peripheral device through at least three sectors in the plane of the plate.

It is a further object of the present invention to provide a cable management system which permits all the cables leading to the peripheral device to enter or exit the footing of the peripheral device through at least three angular orientations spaced apart by 90° and corresponding to exit and entry of the side and rear portions of the device.

That the present invention accomplishes these objects and overcomes the previously described drawbacks of the prior art will be appreciated from the description of the preferred embodiment below.

DETAILED DESCRIPTION OF THE INVENTION

Figure 1:
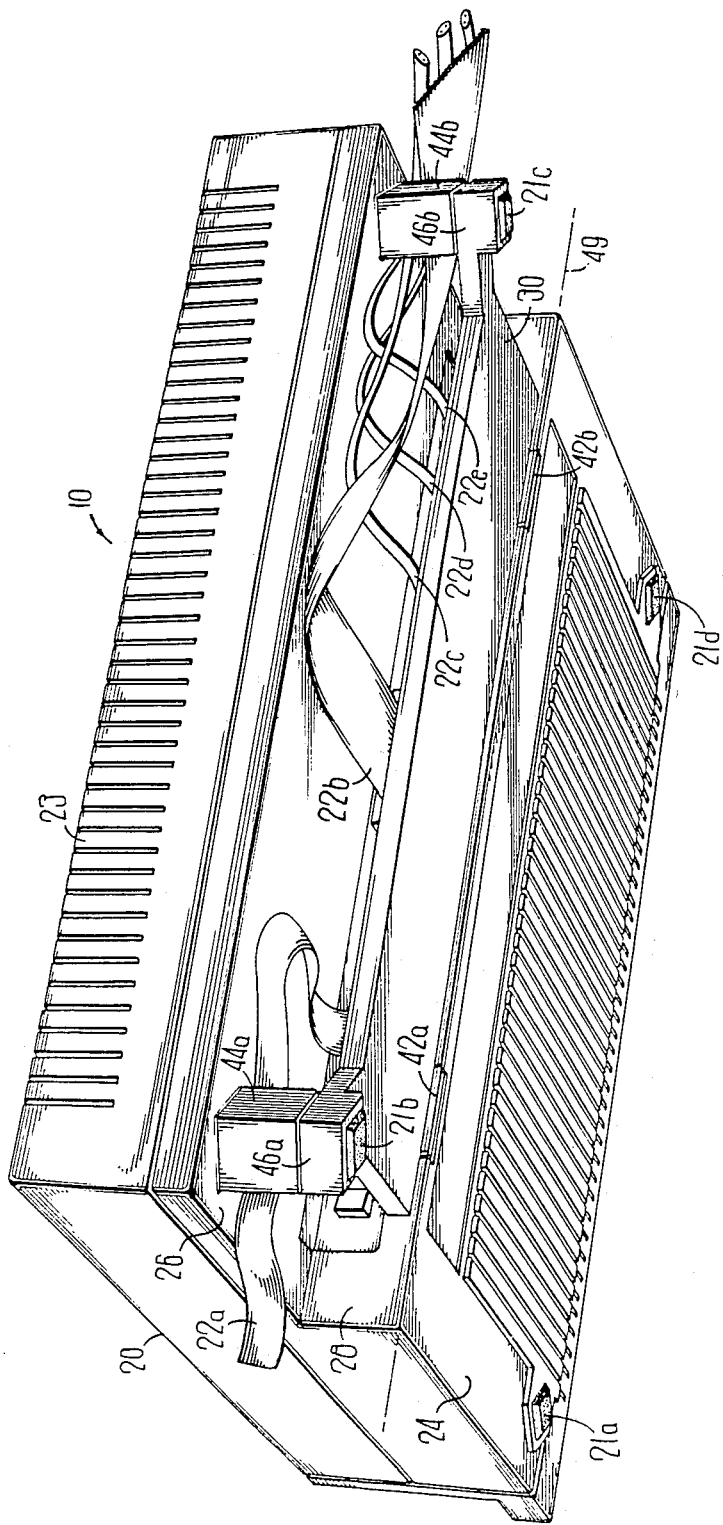
FIG. 1 is a rear elevational view of the preferred embodiment of the cable management system of the present invention, showing the upper and lower stanchion portions engaged and the cables extending from the equipment enclosure.

Turning next to the drawing figures in which like numerals represent like parts, the preferred embodiment of the present invention will now be described.

FIG. 1 shows a cable management system 10 embodying the present invention. The cable management system is designed for implementation in an equipment enclosure 20 which includes a plurality of cable connectors 29a–29e (shown in FIG. 2) connected to a plurality of cables 22a–22e. Equipment enclosure 20 has a bottom cover 24 and a recessed surface 26 formed on the bottom cover 24. On the recessed surface 26, joining the bottom cover 24 along the rear edge thereof, is a vertical wall 28 having the cable connectors 29a–29e (shown in FIG. 2) mounted thereon. The recessed surface 26 extends rearwardly from the upper edge of the vertical wall 28 to the lower edge of the rear surface 23 at the back of the enclosure 20. A plate 30 is connected by hinges 42a and 42b to the vertical wall 28. The plate may be selectively rotated about the axis 49, which is substantially parallel to the vertical wall 28.

Two upper stanchion portions 44a and 44b are disposed on the recessed surface 26. Two lower stanchion portions 46a and 46b are disposed near the distal ends of the plate 30. Footing for the equipment enclosure 20 is provided by feet 21a–21d. Two of such feet are formed on the bottom surface of lower stanchion portions 46a and 46b. The other two feet are formed on the bottom cover 24.

Figure 2:
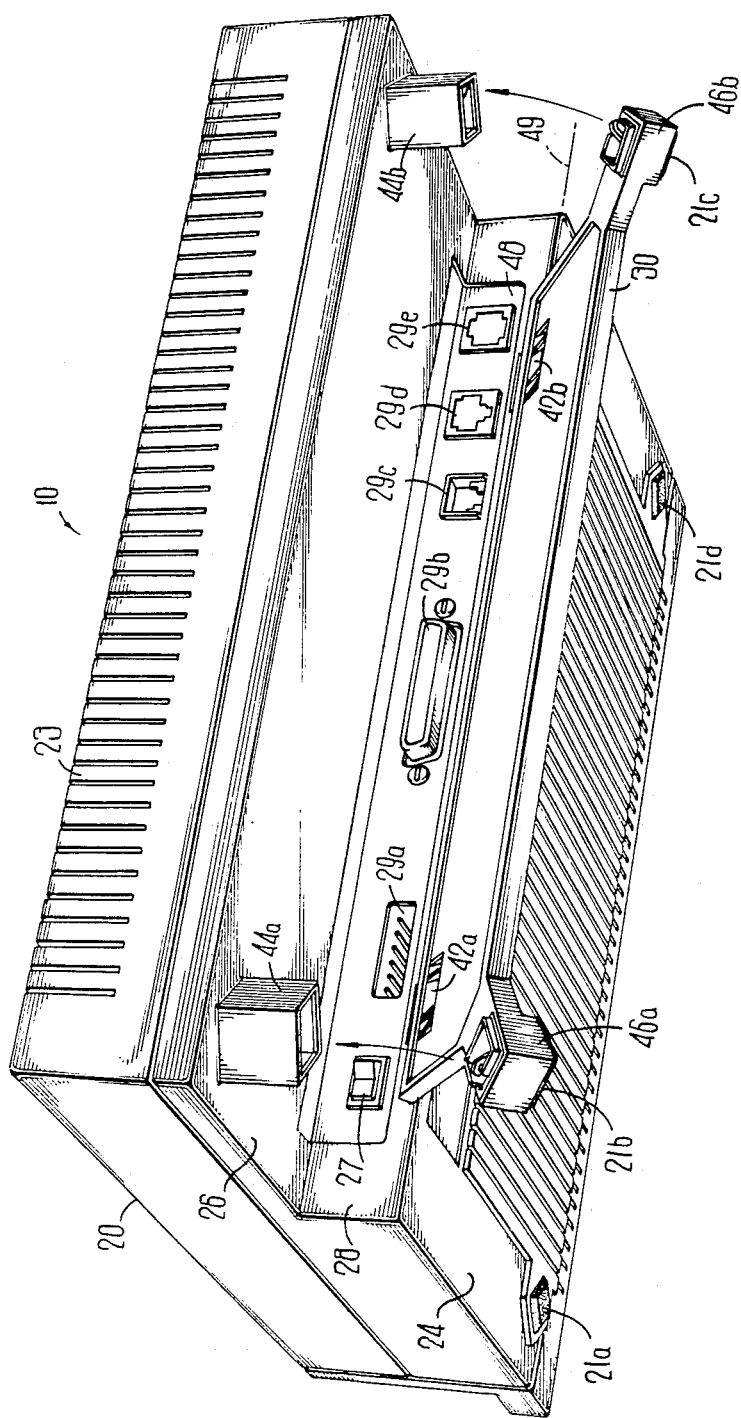
FIG. 2 is a rear elevational view of the embodiment of FIG. 1, showing the upper and lower stanchion portions disengaged.

Operation of the preferred embodiment may be understood by reference to FIGS. 1 and 2. FIG. 1 is a rear view showing a preferred embodiment with the plate 30 moved to a closed position. FIG. 2 is a rear view showing the plate 30 moved to an open position. Movement of the plate 30 is accomplished by rotation around axis 49. Moving the plate 30 to the closed position connects upper stanchion portions 44a and 44b with lower stanchion portions 46a and 46b.

As may be appreciated from viewing FIG. 1, cables 22a–22e are guided by the posts formed by the joining of stanchion portions 44a to 46a and 44b to 46b to enter or exit the footing of the equipment enclosure 20 at the sides of the device. The equipment enclosure 20 thus may be abutted at its rear surface 23 against the rear wall of an equipment cabinet or the like. Inasmuch as the cables 22a–22e may hang down the sides of the plate 30 in the recessed area formed by the recessed surface 26 on the bottom cover, the equipment enclosure 20 may also be abutted at its side surfaces against the side walls of an equipment cabinet or the like.

FIG. 2 is a rear pictorial view of the embodiment of FIG. 1, showing the upper and lower stanchion portions disengaged and the cables removed. In FIG. 2 it is possible to see cable connectors 29a–29e on panel 48 mounted on the vertical wall 28 which connects recessed surface 26 to the bottom cover 24. Those skilled in the art will recognize that these connectors may include, for example, a serial data communication port using the standard DB-25 connector 29b. Connector 29a is a 6 pin recessed plug for accepting a customized power cable used with the preferred embodiment. Telephone jacks 29c through 29e are for accepting United States standard telephone connectors, 29d and 29e being for a dial-up and leased line connection, and 29c being for a standard telephone set. A power switch in the form of a rocker switch is also shown at 27 on panel 48. Naturally, the cable connectors adopted in any embodiment of the present invention can, within the physical limits of a size constraint, by any type of connector. The cables 22a–22e thereby connected to the equipment enclosure 20 are removable, permitting the user to change or replace cables.

The structural features of plate 30 are shown in FIGS. 1 and 2. Plate 30 is substantially rectangular in shape, and is connected to the vertical wall 28 by hinges 42a and 42b. Plate 30 has two lower stanchion portions 46a and 46b disposed near the distal end of plate 30. These stanchion portions define three partially apertured sectors in the plane of the plate.

FIGS. 1 and 2 will now be used to explain the operation of the preferred embodiment. A user desiring to connect a plurality of cables to the computer peripheral device within the equipment enclosure 20 first selects the appropriate cables. Next, the user will move plate 30 to its open position shown in FIG. 2. Thereafter, cables 22a–22e are inserted into cable connectors 29a–29e until firmly seated.

Next, the user rotates plate 30 to its closed position which is shown in FIG. 1. Lower stanchion portions 46a and 46b engage upper stanchion portions 44a and 44b to form posts. It will be appreciated that the substantially rectangular geometry of the plate 30 provides support to the cables 22a–22e, such that the cables do not exert a significant moment to the peripheral device about an axis defined by its rear legs.

It will also be appreciated that the posts formed by the connection of the upper stanchion portions 44a and 44b and the lower stanchion portions 46a and 46b provide direction for all cables leading to the peripheral device so that they enter or exit the footing of the peripheral device at one of a selected plurality of predetermined angular orientations.

The recessed surface 26 allows the other surfaces of the equipment enclosure 20 to be abutted directly against rear or side cabinetry surfaces while permitting the cables to hang directly downward over the rear edge of such furniture. Alternately, the recessed surface 26 allows an arrangement whereby the rear edge of the equipment enclosure containing the peripheral device is substantially co-planar with the rear of a piece of furniture upon which the peripheral is sitting, while permitting the cables to hang downward as described above.

Figure 3:
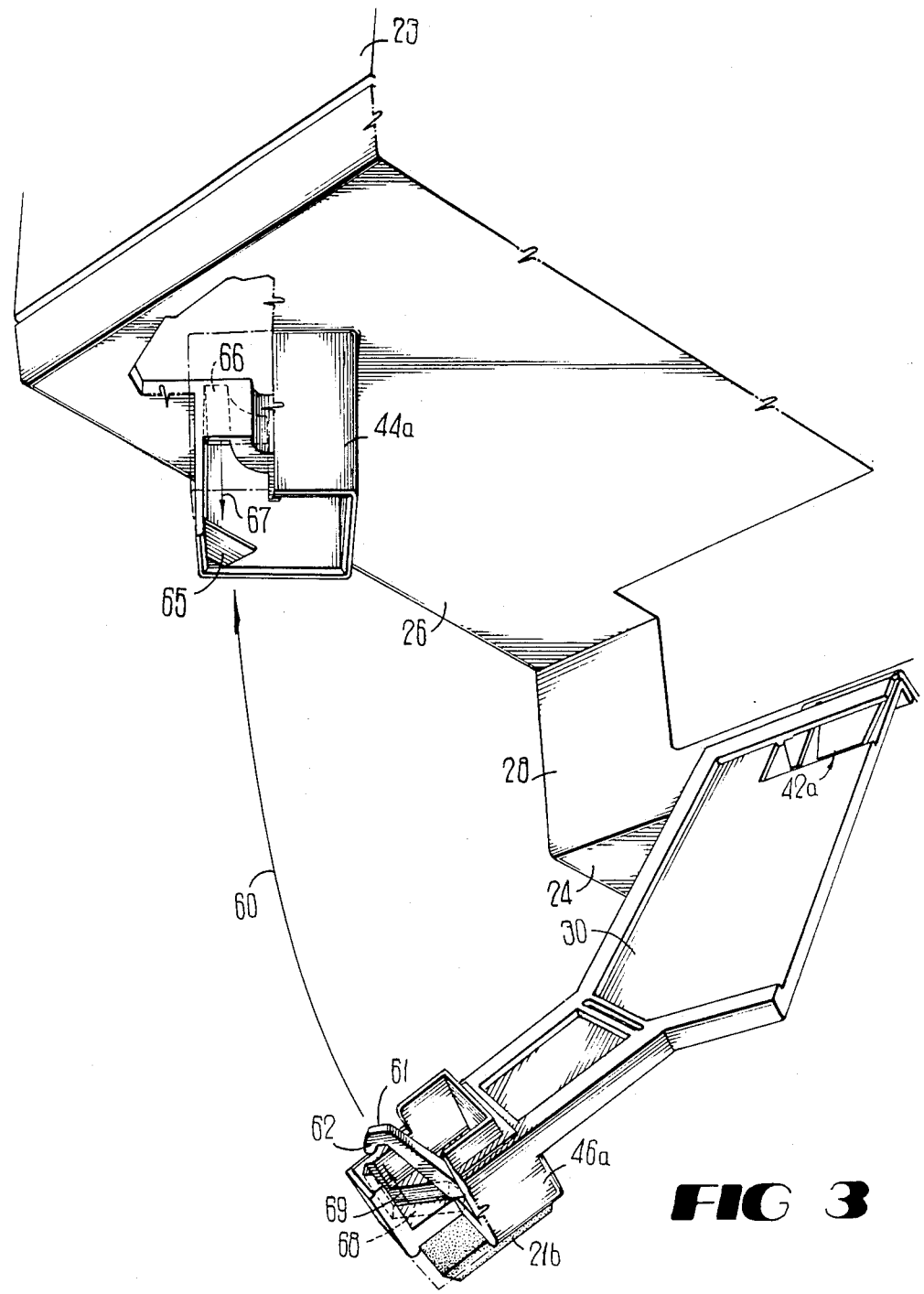
FIG. 3 is a detailed, partially broken away view showing the latching arrangement within the stanchion portions of the preferred embodiment.

FIG. 3 is a partially broken detail showing the interior structure of the stanchion portions of the present invention. As shown in FIG. 3, plate 30 rotates about axis 49 between its open position, as shown in the Figure, and a closed position along an arrow indicated at 60. The latch is composed of a flexible finger 61 disposed within the interior of lower stanchion portion 46a. Finger 61 terminates in a hook portion 62 which engages retaining tab 65 in the interior of upper stanchion portion 44a.

The preferred embodiment of the present invention, and the entire enclosure of which it forms a part, is constructed of injunction molded plastic. Significant problems were presented to the inventors in trying to design an interior mounted latching mechanism for use in the stanchion portions of the preferred embodiment. It is highly desirable to have the latches disposed within the interior for aesthetic purposes. At first it was considered impossible to form such a latch as part of a unitary molding and the alternative of an externally attached separate piece was given serious consideration. However, the parts cost for a separate metallic device, and necessary materials to fasten same, approach twenty-five cents apiece in significant quantities. It will therefore be appreciated that the ability to form the latching apparatus of the preferred embodiment as a part of the injection molded parts leads to considerable cost savings.

First, the design criteria for the latch will be discussed. As noted above, it is desirable to have the latch disposed internally, both for aesthetic purposes, and to prevent breakage thereof in the event that the equipment enclosure is dropped with plate 30 in an open position, thereby bringing the full weight of the device down on latch finger 61. Therefore, a first design criterion was that the latch be disposed internally to the stanchion portions and be recessed sufficiently so that it is not likely to break in the event of a drop with panel 30 open. Secondly, there was a need to provide a significant length to the finger. There are limitations on the lateral deformability of a thin piece of plastic, and a very short finger would have a tendency to take a permanent set after repeated latching operations when hook surface 62 moved laterially in response to contacting surface 65.

Naturally, the main problem to be overcome was how to design surfaces of this type in a way that could be practically molded.

The inventors of the present invention overcame this problem by employing hollow spaces in the product opposite the critical surfaces. A first hollow space 66 is shown in phantom above latching surface 65. Arrow 67 indicates the direction in which the mold piece was inserted to form the top portion of latch surface 65. The hollow space 66 extends all the way through the panel-forming recessed surface 26 into the interior of the equipment enclosure.

Likewise, the area directly below finger 61 and hook end 62 is hollow as indicated in phantom at 68 in FIG. 3. Arrow 69 shows the direction a lower mold piece came through this area to form finger 61 during the molding process.

It should be noted that rubber foot 21b is mounted to a flat recessed area, through which hole 68 passes, in the bottom of lower stanchion portion 46a. Thus, after final assembly, rubber foot 21b covers the hole and provides an attractive and functional apparatus.

The inventors of the present invention believe that the injection molded interior mounted latch of the preferred embodiment is novel per se and, as such, it has its own merit as an invention, apart from the particular details of the cable management system of the preferred embodiment.

Figure 4:
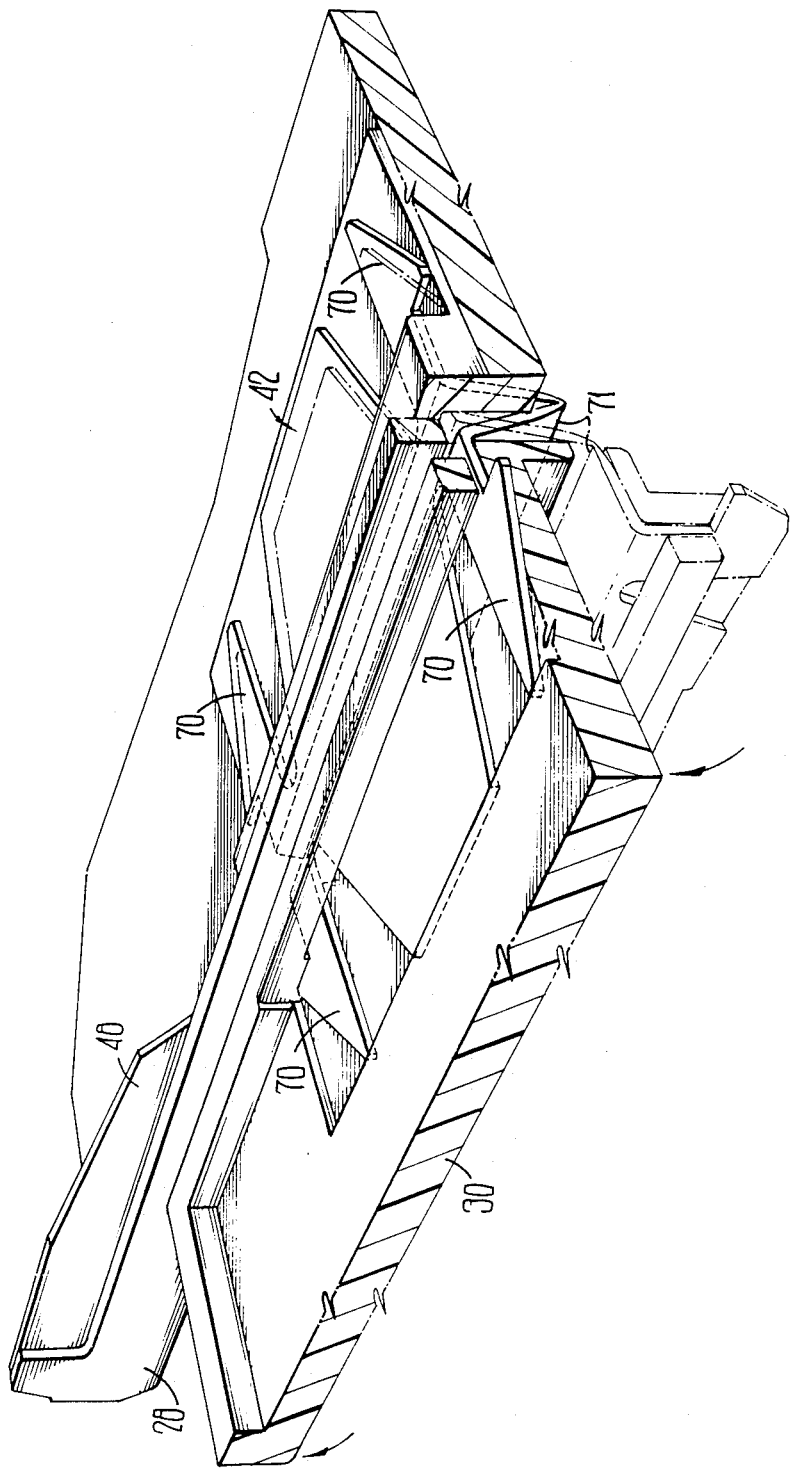
FIG. 4 is a detailed view of the hinge used in the preferred embodiment.

FIG. 4 shows exemplary hinge 42 used in the preferred embodiment. While plastic hinges are not novel per se, the present hinge includes four clip legs 70 which are inserted into slits in rear panel 48 and plate 30 to allow the plate to exhibit the rotational action described hereinabove. The operating edge appears along line 71 in FIG. 4. The thickness of material here is selected so that the hinge will separate from the rear panel 48 or the plate 30 in the event sufficient force is applied to the plate, in an attempt to close it, when there is an obstruction between the upper surface of the plate and recessed surface 26 of the equipment enclosure. Since the plate with its integrally formed stanchion portions is a much more expensive piece than the hinges, it is desired to have the hinges withdraw from the slots in the rear panel 48 or the plate 30 in the situation of undue stress placed on plate 30 since the hinges may be replaced in the slots very easily.

Other embodiments of the present invention will suggest themselves to those skilled in the art. For example, the plate 30 could be shaped in one of any number of geometric configurations. In particular, the plate 30 could be T-shaped, Y-shaped, or V-shaped. Also, as noted hereinabove, the extent of plate 30 is not particularly critical to the present invention. Therefore, embodiments of the invention with separate legs, rather than a continuous plate 30, are clearly within the scope of same. For example, FIG. 3, while showing a cutaway portion of the preferred embodiment employing plate 30 shown in the other drawing figures, can also be thought of as representing an embodiment in which separately attached legs are mounted on the enclosure for rotation about axis 49. The important aspect is that, when the stanchion portions are closed, a closed loop is formed which will keep the cables in place even when the entire apparatus is lifted from the surface upon which it is resting.

The cable management system of the present invention may be manufactured relatively inexpensively and provides direction for cables leading to the enclosure for the computer peripheral device so that the inconvenience associated with moving such devices, once cables have been connected, is minimized.

Additionally, the fact that the cable management system of the present invention is easily manipulated and does not require permanent connection of cables to the computer peripheral device enhances the value and usefulness of the system.

In view of the foregoing description of the embodiment of the cable management system for an equipment enclosure of the present invention, it will be appreciated by those skilled in the art that the present invention accomplishes the objects set forth above and overcomes the previously described drawbacks of the prior art. In view of the foregoing description, it will appreciated by those skilled in the art that many alternative embodiments of the present invention can be created and therefore the scope of the present invention is to be limited only by the claims below.

We claim:
1. A cable management system for an equipment enclosure, comprising in combination:
a bottom cover;
a recessed surface formed on said bottom cover;
a vertical wall along one edge of said recessed surface having a characteristic lower edge and a cable connector mounted thereon;
at least two upper stanchion portions disposed on said recessed surface;
at least two lower stanchion portions disposed near the distal ends of respective arms; and
hinge means for connecting said arms to said vertical wall and for allowing said arms to be selectively moved about an axis substantially parallel to said lower edge so that said upper stanchion portions engage said lower stanchion portions when said arms are moved to a closed position.

2. A cable management system as recited in claim 1, wherein a first means for connecting said upper stanchion portions to said lower stanchion portions is disposed at the free end of each upper stanchion portion, and
a second means for connecting said upper stanchion portions to said lower stanchion portions is disposed at the end of each lower stanchion portion, so that when said first and second connecting means are joined, the connection forms a post to prevent cables connected to said vertical wall from swinging freely in a 180° arc.

3. A cable management system as recited in claim 2, wherein said first means for connecting said upper and lower stanchion portions comprises a keeper formed within each of said upper stanchion portions and said second means for connecting said upper and lower stanchion portions comprises a latch formed within each of said lower stanchion portions.

4. A cable management system for an equipment enclosure, comprising in combination:
a bottom cover;
a recessed surface formed on said bottom cover;
a vertical wall along one edge of said recessed surface having a cable connector mounted thereon;
at least two upper stanchion portions disposed on said recessed surface;
a plate;
hinge means for connecting said plate to a lower edge of said vertical wall and for allowing said plate to be selectively moved about an axis substantially parallel to said lower edge; and
at least two lower stanchion portions disposed on an upper surface of said plate so as to engage said upper stanchion portions when said plate is moved to a closed position.

5. A cable management system as recited in claim 4, wherein a first means for connecting said upper stanchion portions to said lower stanchion portions is disposed at the free end of each upper stanchion portion, and
a second means for connecting said upper stanchion portions to said lower stanchion portions is disposed at the end of each lower stanchion portion so that when said first and second connecting means are joined, the connection forms a post to prevent cables connected to said vertical wall from swinging freely in a 180° arc.

6. A cable management system as recited in claim 5, wherein said first means for connecting said upper and lower stanchion portions comprises a keeper formed within each of said upper stanchion portions and said second means for connecting said upper and lower stanchion portions comprises a latch formed within each of said lower stanchion portions.

7. A cable management system for an equipment enclosure, comprising in conbination:
  a bottom cover;
  a recessed surface formed on said bottom cover and defining part of an exit area to permit exit of cables from said recessed surface and having a cable connector mounted thereon;
  at least two upper stanchion portions descending from said recessed surface; and
  a plate attached by at least one hinge at a hinged end to said bottom cover and having at least two lower stanchion portions distal from said hinged end defining at least three sectors in the plane of the plate, such that said upper stanchion portions engage said lower stanchion portions when said plate is moved to a closed position.

8. A cable management system as recited in claim 7, wherein a first means for connecting said upper stanchion portions to said lower stanchion portions is disposed at the free end of each upper stanchion portion, and
  a second means for connecting said upper stanchion portions to said lower stanchion portions is disposed at the end of each lower stanchion portion, so that when said first and second connecting means are joined the connection forms a post to prevent cables exiting said recessed surface from swinging freely in a 180° arc.

9. A cable management system as recited in claim 8, wherein said first means for connecting said upper and lower stanchion portions comprises a keeper formed within each of said upper stanchion portions and said second means for connecting said upper and lower stanchion portions comprises a latch formed within each of said lower stanchion portions.

10. A cable management system for an equipment enclosure, comprising in combination:
  a bottom cover;
  a recessed surface formed on said bottom cover and defining part of an exit area to permit exit of cables from said recessed surface and having a cable connector mounted thereon;
  at least two upper stanchion portions descending from said recessed surface; and
  a plate attached by at least one hinge at a hinged end to said bottom cover and having at least two lower stanchion portions distal from said hinged end defining at least three sectors in the plane of the plate, said sectors being partially apertured, such that said upper stanchion portions engage said lower stanchion portions when said plate is moved to a closed position.

11. A cable management system as recited in claim 10, wherein a first means for connecting said upper stanchion portions to said lower stanchion portions is disposed at the free end of each upper stanchion portion, and
  a second means for connecting said upper stanchion portions to said lower stanchion portions is disposed at the end of each lower stanchion portion, so that when said first and second connecting means are joined, the connections form posts defining at least three cable exit ports so that cables may hang down in the apertured regions of said sectors.

12. A cable management system as recited in claim 11, wherein said first means for connecting said upper and lower stanchion portions comprises a keeper formed within each of said upper stanchion portions and said second means for connecting said upper and lower stanchion portions comprises a latch formed within each of said lower stanchion portions.

* * * * *